(12) United States Patent
Li et al.

(10) Patent No.: US 7,508,674 B2
(45) Date of Patent: Mar. 24, 2009

(54) FIXTURE FOR ATTACHING A HEAT SINK TO A HEAT GENERATING DEVICE

(75) Inventors: Jing Xin Li, Taipei (TW); Tsai Kuei Cheng, Taipei (TW)

(73) Assignee: Inventec Corporation, Taipei (TW)

( * ) Notice: Subject to any disclaimer, the term of this patent is extended or adjusted under 35 U.S.C. 154(b) by 299 days.

(21) Appl. No.: 11/395,425

(22) Filed: Mar. 30, 2006

(65) Prior Publication Data

US 2007/0044282 A1 Mar. 1, 2007

(30) Foreign Application Priority Data

Aug. 24, 2005 (TW) .............................. 94214510 A

(51) Int. Cl.
*H05K 7/20* (2006.01)
*H01L 23/34* (2006.01)

(52) U.S. Cl. ................. 361/704; 361/709; 361/719; 165/80.3; 165/185; 257/718; 257/719

(58) Field of Classification Search .......... 257/718, 257/719; 361/719, 704, 709; 165/80.2, 80.3, 165/185; 24/455
See application file for complete search history.

(56) References Cited

U.S. PATENT DOCUMENTS

| | | | | |
|---|---|---|---|---|
| 4,066,201 A | * | 1/1978 | Bleckmann | 228/115 |
| 5,011,566 A | * | 4/1991 | Hoffman | 216/58 |
| 6,392,886 B1 | * | 5/2002 | Lee et al. | 361/703 |
| 6,424,530 B1 | * | 7/2002 | Lee et al. | 361/704 |
| 6,496,371 B2 | * | 12/2002 | Winkel et al. | 361/703 |
| 6,518,507 B1 | * | 2/2003 | Chen | 174/252 |
| 6,590,771 B2 | * | 7/2003 | Sopko et al. | 361/704 |
| 6,644,387 B1 | * | 11/2003 | Lee et al. | 165/80.3 |
| 6,768,641 B2 | * | 7/2004 | Li | 361/719 |
| 6,803,652 B2 | * | 10/2004 | Winkel et al. | 257/706 |
| 2003/0016501 A1 | * | 1/2003 | Chen | 361/704 |

FOREIGN PATENT DOCUMENTS

| | | |
|---|---|---|
| TW | 2003-564009 | 11/2003 |
| TW | 2004-246982 | 10/2004 |

* cited by examiner

*Primary Examiner*—Jayprakash N Gandhi
*Assistant Examiner*—Zachary M Pape

(57) ABSTRACT

A heat sink fixture for fixing a heat sink to a heat generating device is disclosed. The heat sink fixture at least has a suppressing section, two force-exertion sections and two fixing sections. The suppressing section is used to suppress the heat sink. The force-exertion sections are respectively bent upwards and extended away from both ends of the suppressing section. The ends of the force-exertion sections are bent and hollow. The fixing sections are respectively extended from the force-exertion sections for being fixed to the heat generating device. The heat sink fixture decreases difficulty in assembling.

6 Claims, 4 Drawing Sheets

FIXTURE FOR ATTACHING A HEAT SINK TO A HEAT GENERATING DEVICE

BACKGROUND OF THE INVENTION

1. Field of the Invention

The present invention relates generally to fixing technologies, and more particularly, to a heat sink fixture for fixing a heat sink to a heat generating device.

2. Description of Related Art

Computing speed of the present computer system is increasingly faster, and the amount of operations becomes increasingly larger, so when the computer is under full load, surface temperature of a processing unit, e.g., a Central Processing Unit (CPU) or a microprocessor, that can generate a great deal of heat, often may be higher than 100° C. Thus, in order to solve such an overheating problem, one common approach is to provide a heat dissipating apparatus, such as a heat sink, a fan and the like, in the computer, so as to dissipate the heat that is produced by the heat generating device (CPU or microprocessor).

To assemble a heat sink in a computer, a heat sink fixture is usually used to closely press the heat sink against the heat generating device and fix it in place, so that the heat sink does not easily slip away or loosen and will be able to dissipate heat efficiently as required. The heat sink fixture is very critical to heat dissipation, since if there is not a good heat sink fixture even the perfect heat sink is useless. The ideal heat sink fixture allows the heat sink to make even and close contact with the heat generating device, thereby decreasing the thermal impedance between the interfaces and enhancing the heat-absorption capacity of the heat sink bottom. There are many related patents that disclose heat dissipating fixtures, for example, Taiwan Utility Publication No. 246,982 and No. 564,009.

The Taiwan Utility Publication No. 246,982 proposes a latching member structure between a CPU and a heat sink. The latching member structure is essentially a metallic bar. A leaning section is provided at the centre of the metallic bar, and both sides of the leaning section symmetrically extend and slant upward to form spring members. From the tail of each spring member, a fastener extends downwards and an ear portion extends upwards. The bottom part of the fastener forms a latching hole. During assembling, the latching member is disposed in a slot of the heat sink, in that the leaning section acts as a pivot and the fasteners at either side of the leaning section are moved downwards by pressing the spring members, so that the latching holes are latched to projections symmetrically provided on the corresponding sides of a CPU socket; while disassembling, the latching hole can be unlatched from the projections by pulling the two ear potions inwards, thereby making disassemble and assemble conveniently and preventing distortion due to overheating.

However, the above-discussed latching member structure between the CPU and the heat sink employs the leaning section at the middle of the latching member to directly press against the heat sink. During assembling, the leaning section experiences pressure due to deformation of the spring members. The force exerted onto the heat sink is only through the small area at the bottom of the leaning section, in other words, the pressure is not evenly applied to the heat sink such that the CPU and the heat sink cannot be closely combined together, thus degrading the heat dissipation.

Moreover, since the contact area between the latching member and the heat sink is small and the applied pressure is constrained, the fixing of the heat sink is unstable and easy to slide due to improper contact or vibration when maintaining, such that the contact area between the CPU and the heat sink may be decreased, resulting in poor heat dissipation of the CPU.

Taiwan Utility Publication No. 564,009 proposes a latching apparatus that closely joins a heat sink with a heat generating device. The latching apparatus for the heat sink is made by bending an elastic metal spring strip to essentially have a pressing section and two arms. The middle of the force-exertion section is horizontally formed with a ring-shaped enclosing section, which is used to loop around a circular structure of the heat sink so that the latching apparatus is correctly oriented on the heat sink. Both ends of the enclosing section extend horizontally to form extending sections for pressing against the heat sink. The two arms are respectively formed at the end of extending sections extending at substantially vertically bent, and a hook is formed at both ends of the arms for fastening to corresponding component.

However, when applying the above-discussed latching apparatus for heat sinks, as shown in FIG. 1 (PRIOR ART), the area at the end 101 of each extending section of the two arms 10 available for pressing is small, it may cause pain to the fingers of assembly operators who need to frequently pressing the ends 101 of the latching apparatus. In addition, the pressing direction for this type of latching apparatus is shown by arrow A of FIG. 1 (PRIOR ART), which requires a much larger force to be applied for assembling.

Furthermore, during the process of assembling the above-discussed conventional latching apparatus for heat sinks, force must be imposed on both sides of the heat sink, accordingly, the space required for operation is inevitably larger than the physical space of the heat sink, which causes unnecessary space waste. Furthermore, the force applied to the heat sink is not even, so it also exhibits the problem of an unstable fixing as described previously.

Accordingly, there exists a strong need in the art for a fixing technology for heat sink that is capable of decreasing difficulty in assembling operation, reducing the space required for assembling and exhibiting a shock damping effect.

SUMMARY OF THE INVENTION

Accordingly, it is an aspect of the present invention to solve the aforementioned problems by providing a heat sink fixture which is capable of decreasing difficulty of the assembling operation.

It is another aspect of the present invention to provide a heat sink fixture which can make assembling operation more comfortable.

It is a further aspect of the present invention to provide a heat sink fixture which can save more space.

It is yet another aspect of the present invention to provide a heat sink fixture which can exhibit the shock damping effect.

The present invention provides a heat sink fixture for fixing a heat sink to a heat generating device according to the present invention is proposed. The heat sink fixture at least includes a suppressing section, a plurality of force-exertion sections and a plurality of fixing sections. The suppressing section is used to suppress the heat sink. The force-exertion sections are respectively bent upwards and extended from both ends of the suppressing section, wherein the ends of the force-exertion sections are bent and hollow. The fixing sections are respectively extended from the force-exertion sections for fixing onto the heat generating device.

Preferably, the suppressing section is in a stair-like shape. The suppressing section is divided into a middle part and two suppressing parts extending from opposite sides of the middle part. The middle part may have a bar shape, a ring shape or other equivalent shape so long as it can be positioned at approximately the center of the heat sink. The ends of the force-exertion sections are bent and hollow, forming a planar pressing area. Moreover, the height for the force-exertion sections is designed to be higher than that of the heat sink. The angle between the suppressing section and the force-exertion sections can be for example 90 degrees. The fixing section is preferably in the shape of a hook. The angle between the fixing section and the ends of the force-exertion sections can be for example 45 degrees. In addition, the fixing sections and the ends of the force-exertion sections can be selected from elastic materials, which can absorb shock impacted on the heat sink.

Compared with the conventional technology, the present invention can be designed to have force-exertion sections with planar area for force to be exerted and a fixing section capable of shock damping. Moreover, the angle between the force-exertion areas of the force-exertion sections and the fixing sections are selected to be an angle easily controlled by the user during assembling, thereby making it easier and more comfortable to operate. Accordingly, the problems of the conventional technology can be solved, for example, a small area at the end of each extending section of the two arms for the finger to frequently press causes pain in the finger, and that a large force is required for pressing the extending section of the two arms.

Furthermore, the present invention allows force to be applied to the force-exertion sections from a vertical direction instead of lateral sides of the heat sink in the prior art, thus conserving more space.

In addition, the elastic force-exertion sections and fixing sections designed by the present invention not only makes assembling operation more comfortable, but also exhibits a shock damping function, thereby protecting the heat sink from shock.

Further, the heat sink fixture of the present invention allows force to be evenly exerted onto the heat sink via the suppressing section that laterally positioned across the heat sink, avoiding the problems of low heat dissipation as well as unstable fixing due to uneven contact between the heat sink and the heat generating device in the prior art.

The following description contains specific information pertaining to the implementation of the present invention. One skilled in the art will readily recognize other aspects and features of the present invention after reviewing what specifically disclosed in the present application. It is manifest that the present invention can be implemented and applied in a manner different from that specifically discussed in the present application. It should also be understood that the invention is not limited to the particular exemplary embodiments described herein, but is capable of many rearrangements, modifications, and substitutions without departing from the spirit of the present invention.

DESCRIPTION OF THE PREFERRED EMBODIMENTS

The following embodiments are used to describe the concept of the present invention in more details, but they are intended to limit the scope of the present invention.

Figure 1:
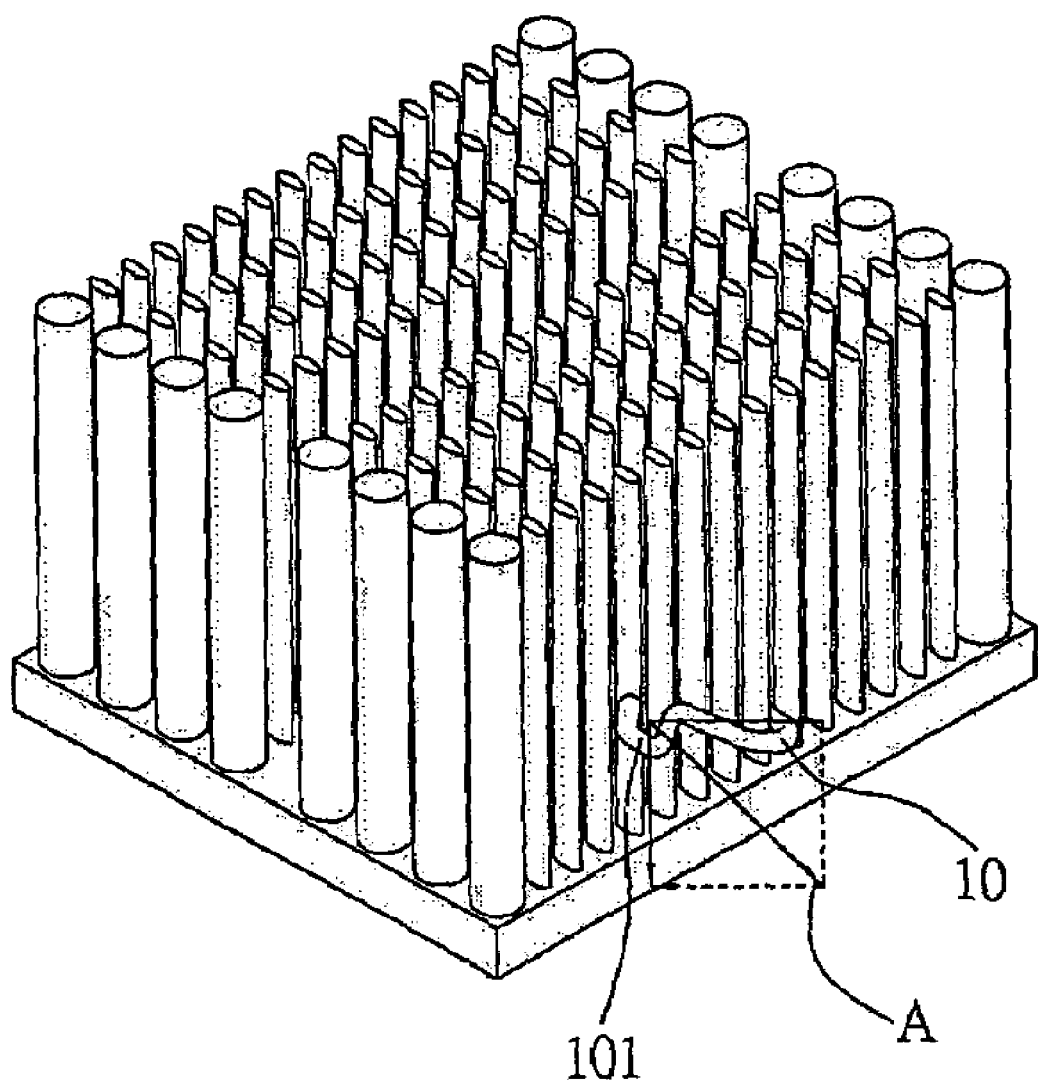
FIG. 1 (PRIOR ART) depicts a schematic diagram of a conventional heat sink fixture mounted to a heat sink.
Figure 2A:
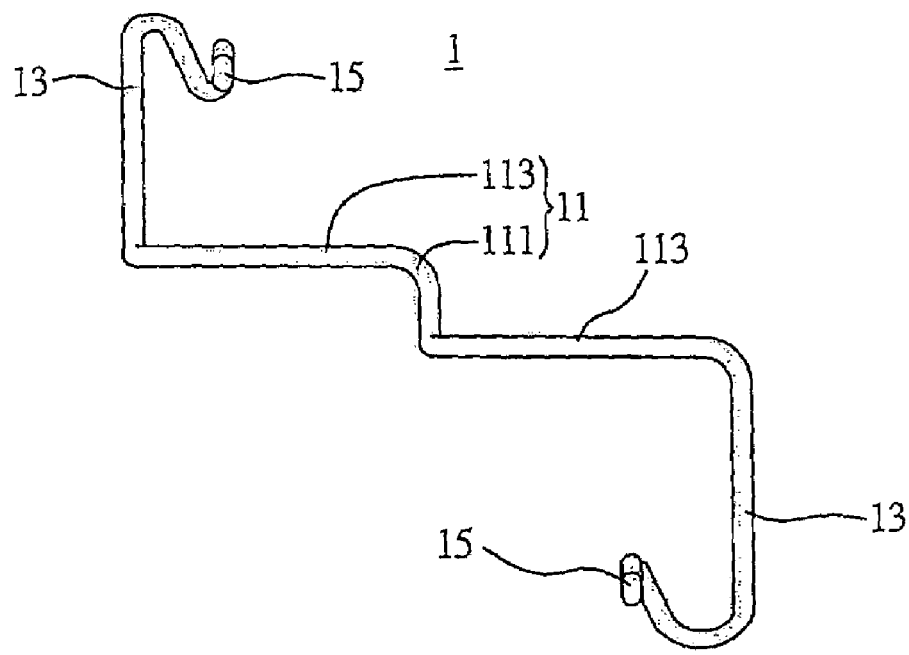
FIGS. 2A through 2D depict schematic diagrams of a preferred embodiment of a heat sink fixture of the present invention, wherein a top view, an elevation view, a side view and a stereogram of the heat sink fixture are shown in FIGS. 2A, 2B, 2C and 2D, respectively.
Figure 2B:
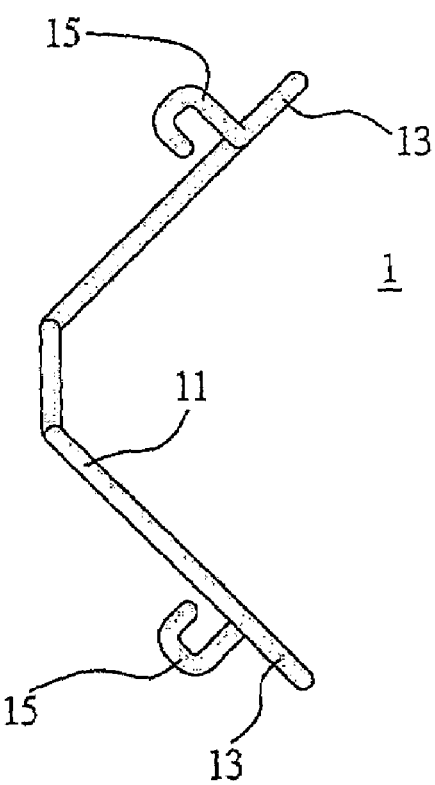
Figure 2C:
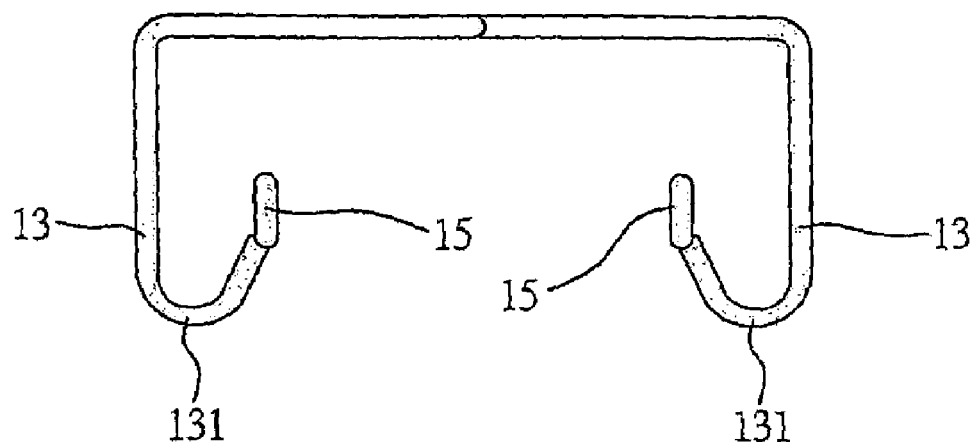
Figure 2D:
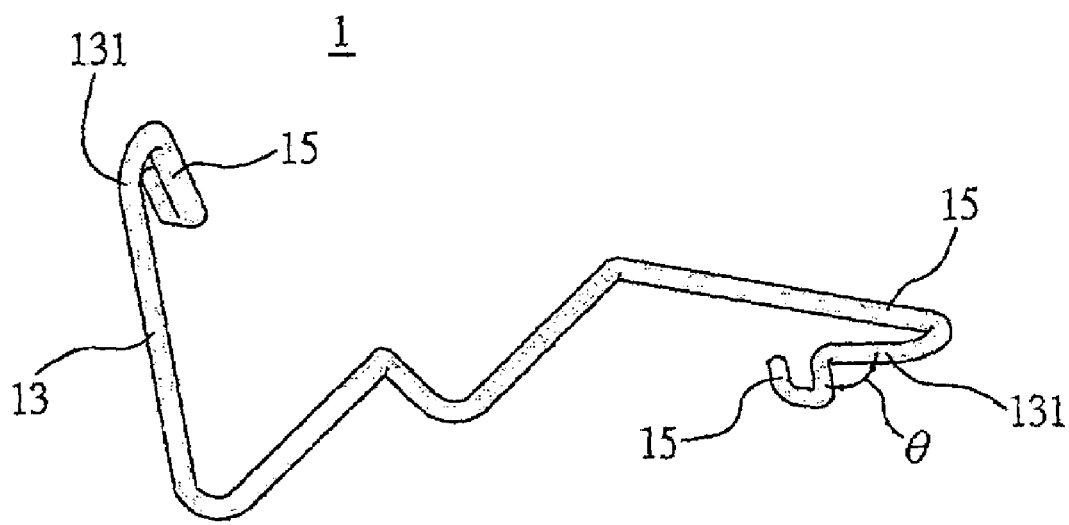
Figure 3:
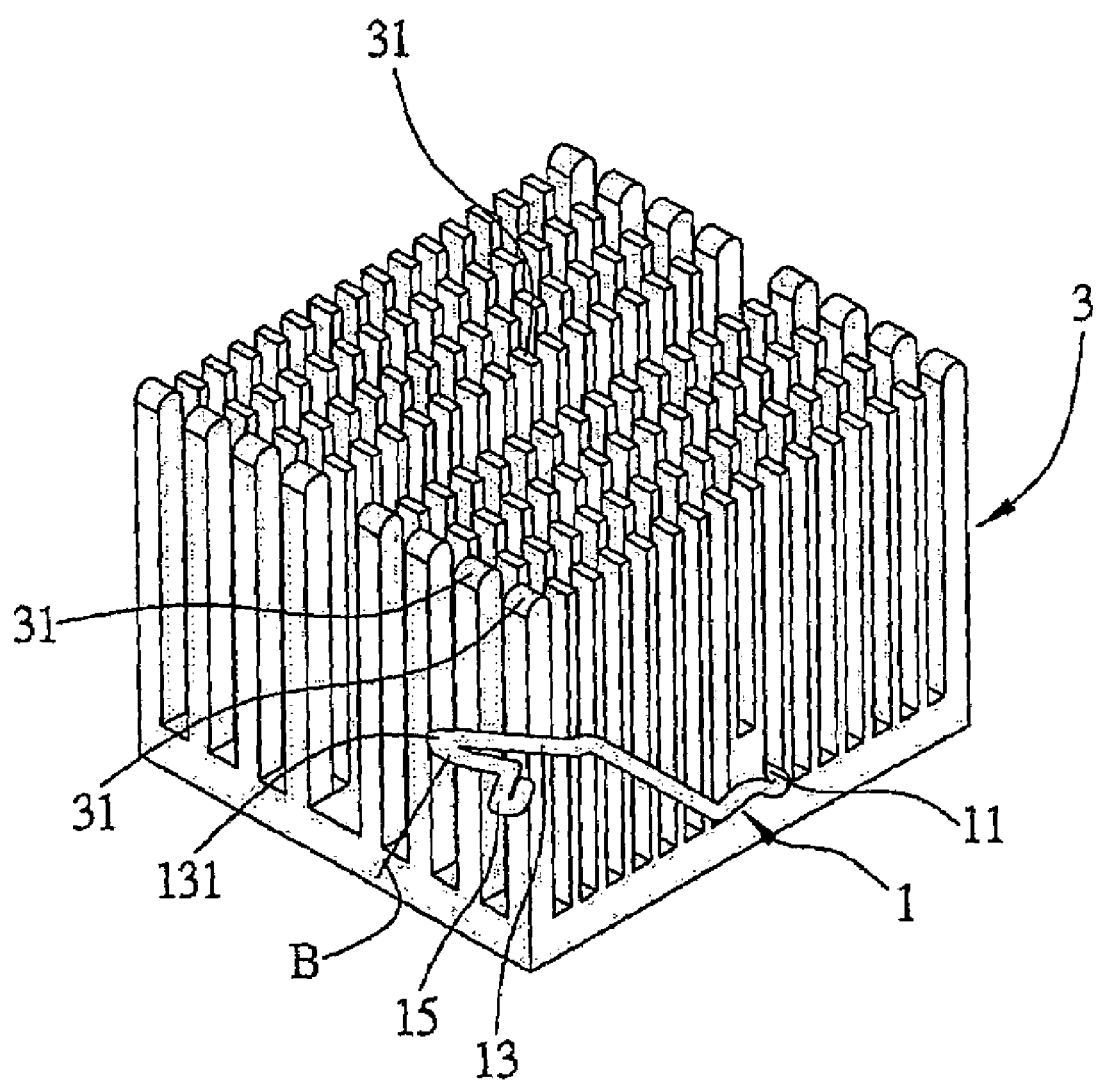
FIG. 3 depicts a schematic diagram of the preferred embodiment of the heat sink fixture of the present invention mounted to a heat sink.

FIGS. 2A through 3 depict various views of a preferred embodiment of the heat sink fixture according to the present invention. It should be noted that the heat sink fixture according to the present invention is used to closely joint a heat sink with a heat generating device such as a CPU or a microprocessor, but it is not limited to those described herein. Since a conventional heat sink, CPU, microprocessor or other heat generating device and heat dissipating apparatus are well known to one with ordinary skill in the art, only the components directly pertaining to the present invention is illustrated. However, it should be clear that the present invention is not limited to the structures of the heat generating device and heat dissipating apparatus described herein.

With reference to FIGS. 2A through 2D, the heat sink fixture 1 according to the preferred embodiment can be a bent elastic metal spring strip, and the heat sink fixture 1 comprises a suppressing section 11, two force-exerting sections 13 and two fixing section 15. As shown in FIG. 3, the heat sink fixture 1 is used to fix a heat sink 3 to a heat generating device (not illustrated).

With reference to FIG. 2A and FIG. 3, the suppressing section 11 is used to suppress the heat sink 3. In this exemplary embodiment, the suppressing section 11 has a stair-like shape, and is divided into a middle part 111 and two suppressing parts 113 oppositely extending from the middle part 111. The overall length of the suppressing section 11 is equal to a width of the heat sink 3 that is desired to be located. The middle part 111 has a bar shape for fixing bar-shaped fins 31 at approximately the middle part of the heat sink 3. The two suppressing parts 113 that are perpendicular to the middle part 111 and in parallel to each other are used to fix the part of the heat sink 3 from the center to the edge.

It should be noted that the overall length of the suppressing section 11 in this embodiment depends on the width of the heat sink 3 that is desired to be located. If the suppressing section 11 is not used to suppress two opposite sides of the heat sink 3 but rather the diagonal of the heat sink 3 as in the other embodiments, the overall length of the suppressing section 11 can be equal to the diagonal length of the heat sink 3.

Although the middle part 111 is described as a bar shape for fixing the fins 31 at approximately the middle of the heat sink 3, but in other embodiments, if the shape of the fins of the heat sink 3 are not bar like, the shape of the middle part 111 can be changed accordingly; in other words, if the shape of the fins of the heat sink 3 is cylindrical or other forms, the middle part 111 can also be changed accordingly to have a shape of a ring or whatever that correspondingly matches with that of the fins. Thus, one with ordinary skill in the art can change the shape of the middle part 111 according to the actual requirements without departing from the scope of the present invention.

With reference to FIG. 2B and coupled with FIG. 3, the two force-exertion sections 13 are respectively bent upwards and extended away from both ends of the suppressing section 11, i.e., are respectively bent upwards and extended away from the two suppressing parts 113. As shown in FIG. 2C, the ends 131 of the two force-exertion sections 13 are bent and hollow. In the exemplary embodiment, the ends 131 of the two force-exertion sections 13 are bent so as to form a gradually larger hollow portion, such that a planar force-exertion area is created that allows a user's fingers to exert force on this hollow area without feeling painful. Furthermore, the height of the two warping force-exertion sections 13 is greater than that of the heat sink 3, so as to make the operation simpler and more efficient when applying a force from a vertical direction on the two force-exertion sections 13 when fixing.

It should be understood that the angle between the respective suppressing section 11 and the force-exertion sections 13 in this embodiment is illustrated as 90 degree, but when the heat sink 3 is not rectangle or the suppressing section 11 is not used to suppress two opposite sides of the heat sink 3 but rather a diagonal of the heat sink 3, the angle between the respective suppressing section 11 and the force-exertion sections 13 can also be changed accordingly.

Moreover, the bending angle of the hollow area is also not limited to that illustrated in the drawings, as long as it forms a plane for force to be easily exerted by the users. One with ordinary skill in the art may modify or change the angle according to actual requirements and design.

With reference to FIG. 2C and in conjunction with FIG. 3, the two fixing sections 15 are respectively extended from both ends 131 of the force-exertion section 13 for fixing onto the heat sink 3. Referring to FIG. 2D, in this embodiment, the two fixing sections 15 are for example hook shapes for hooking to a corresponding component (not illustrated) of the heat generating device. The angle θ between the respective fixing sections 15 and the ends 131 of the two force-exertion sections 13 can be for example 45 degrees, making the fixing much easier. Furthermore, as shown in FIG. 2D, the two fixing sections 15 and the ends 131 of the two force-exertion sections 13 may be elastic to absorb impact on the heat sink due to shock.

It should be understood that the angle θ between the respective fixing sections 15 and the ends 131 of the two force-exertion sections 13 is for example 45 degrees, which is easy for the user to control, but the present invention is not limited to this. Additionally, the two fixing sections 15 in the embodiment are formed as hooks, but the number and shape of the fixing sections 15 can also be changed as long as it can be best fixed to a corresponding component of the heat generating device.

When the heat sink fixture 1 of this embodiment is used to closely joint the heat sink 3 with the heat generating device, the suppressing section 11 of the heat sink fixture 1 is used to press against the heat sink 3. For example, firstly, the middle part 111 of the suppressing section 11 is positioned on approximately the centre of the heat sink 3, and the two suppressing parts 113 of the suppressing section 11 are laterally positioned across the heat sink 3. Next, the ends 131 of the two force-exertion sections 13 are pressed by the users in a direction shown by arrow B in FIG. 3. Finally, the two fixing sections 15 are fastened to the corresponding component of the heat generating device; thereby the heat sink 3 can be closely jointed with the heat generating device.

Compared with the conventional technology, the present invention employs the two force-exertion sections 13 during assembling to change the pressing direction, allowing less force to be exerted. Additionally, the area available for exerting force (at the hollow part of the ends 131 of the two sections 13) is bigger, thereby solving the drawbacks of the conventional technology. Thus, a heat sink fixture of the present invention provides an easier and more comfortable assembling operation.

Moreover, since the two force-exertion sections 13 according to the present invention change the operating direction, thus more space is saved compared to the prior art. In addition, the force-exertion sections 13 and the fixing sections 15 of the heat sink fixture of the present invention are designed to be elastic, thereby more efficiently absorbing shock impacted on the heat sink 3.

Accordingly, the present invention not only proposes a heat sink fixture that is capable of decreasing difficulty in the assembling process, but also makes the assembling operation more comfortable, requires less space, and protects the heat generating device from shock, solving various drawbacks of the conventional technology.

The above-described exemplary embodiments are to describe various objects and features of the present invention as illustrative and not restrictive. A person of ordinary skill in the art would recognize that changes and modifications could be made in form and detail without departing from the sprit and the scope of the invention. Thus, the right protective scope of the present invention should fall within the appended claim.

What is claimed is:

1. A fixture for attaching a heat sink to a heat generating device, the fixture comprising:
    a suppressing section for suppressing the heat sink;
    a plurality of force-exertion sections bent upwards and extended away respectively from two ends of the suppressing section, with ends of the force-exertion sections being bent to form a planar and gradually larger curve portion on which force is exerted; and
    a plurality of fixing sections respectively extended from the ends of the force-exertion sections, for being fixed to the heat generating device, wherein each of the fixing sections is of a hook shape, and an angle between each of the fixing sections and a corresponding one of the ends of the force-exertion sections is 45 degrees.

2. The fixture of claim 1, wherein the suppressing section is stair-shaped.

3. The fixture of claim 1, wherein the suppressing section is divided into a middle part and two suppressing parts extended from opposite ends of the middle part.

4. The fixture of claim 3, wherein the middle part has a shape selected from the group consisting of a bar shape and a ring shape.

5. The fixture of claim 1, wherein an angle between the suppressing section and the force-exertion sections is 90 degrees.

6. The fixture of claim 1, wherein the fixing sections and the ends of the force-exertion sections are elastic.

* * * * *